（12）United States Patent
Veneroso et al.

(10) Patent No.: US 9,235,345 B2
(45) Date of Patent: Jan. 12, 2016

(54) METHOD AND SYSTEM FOR CONTROLLING LOSS OF RELIABILITY OF NON-VOLATILE MEMORY

(75) Inventors: Amedeo Veneroso, Caserta (IT); Francesco Varone, Bellona (IT); Pasquale Vastano, S. Maria Capua Vetere (IT); Vitantonio Distasio, Caserta (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 202 days.

(21) Appl. No.: 13/977,343

(22) PCT Filed: Dec. 23, 2011

(86) PCT No.: PCT/EP2011/006555
§ 371 (c)(1),
(2), (4) Date: Jun. 28, 2013

(87) PCT Pub. No.: WO2012/089334
PCT Pub. Date: Jul. 5, 2012

(65) Prior Publication Data
US 2013/0290617 A1     Oct. 31, 2013

(30) Foreign Application Priority Data
Dec. 30, 2010  (IT) .............. MI2010A2472

(51) Int. Cl.
*G06F 3/00*  (2006.01)
*G06F 13/00*  (2006.01)
*G11C 29/00*  (2006.01)
*G06F 3/06*  (2006.01)
*G06F 11/00*  (2006.01)
*G07F 7/08*  (2006.01)
*G11C 29/50*  (2006.01)
*G06F 12/02*  (2006.01)
*G11C 16/04*  (2006.01)
*G11C 29/04*  (2006.01)

(52) U.S. Cl.
CPC ............ *G06F 3/0614* (2013.01); *G06F 11/008* (2013.01); *G06F 12/0246* (2013.01); *G07F 7/082* (2013.01); *G11C 29/50* (2013.01); *G11C 29/50016* (2013.01); *G11C 16/04* (2013.01); *G11C 2029/0409* (2013.01); *G11C 2029/5002* (2013.01)

(58) Field of Classification Search
None
See application file for complete search history.

(56) References Cited

U.S. PATENT DOCUMENTS

| 5,909,404 | A | 6/1999 | Schwarz |
| 2006/0028871 | A1 | 2/2006 | Suzuki |

(Continued)

FOREIGN PATENT DOCUMENTS

| JP | 7065592 | 3/1995 |
| JP | 2003022425 | 1/2003 |

(Continued)

*Primary Examiner* — Idriss N Alrobaye
*Assistant Examiner* — Richard B Franklin
(74) *Attorney, Agent, or Firm* — Allen, Dyer, Doppelt, Milbrath & Gilchrist, P.A.

(57) ABSTRACT

A method for controlling a loss of reliability of a non-volatile memory (NVM) included in an integrated circuit card (ICC) may include determining whether the NVM is reliable at the operating system (OS) side of the ICC, and generating an event associated with the reliability of the NVM at the OS side for an application of the ICC, if the NVM is determined to be unreliable.

13 Claims, 2 Drawing Sheets

APPLICATIONS REQUEST UICC
OS TO TAKE ACTIONS
(SERVICES)

UICC OS NOTIFIES
APPLICATIONS ABOUT
DETECTION OF FLASH ISSUES
(EVENTS)

(56) References Cited

U.S. PATENT DOCUMENTS

2008/0046649 A1 2/2008 Ito
2011/0239061 A1* 9/2011 Li ................................ 714/704

FOREIGN PATENT DOCUMENTS

WO 2008042467 4/2008
WO 2008154119 12/2008

* cited by examiner

METHOD AND SYSTEM FOR CONTROLLING LOSS OF RELIABILITY OF NON-VOLATILE MEMORY

FIELD OF THE INVENTION

The present invention relates to a method and system for controlling loss of reliability of a non-volatile memory (NVM). More specifically, the invention relates to a method and system of the type cited above, wherein the non-volatile memory is included in a Integrated Circuit Card (ICC).

BACKGROUND OF THE INVENTION

As may be known, Integrated Circuit Cards (ICCs) comprise at least a CPU, a volatile memory, and a non volatile memory (NVM). ICCs are used for a wide range of applications involving different devices. For example, when used for telecommunication applications, ICCs are coupled to a GSM/UMTS handset device including a man to machine interface which allows a user to manage the ICC. The ICC may also be used in a machine-to-machine (M2M) application, wherein a system device is coupled to the ICCs and no man to machine interface is provided. Moreover, ICC machine-to-machine (M2M) applications generally comply with different hardware and/or software requirements with respect to ICCs incorporated into handset devices, depending on the specific application they serve.

For example, an emergency ICC device reporting failures of a lift in a building has a stable voltage supply, and the internal ICC is continuously powered on, for example for several years. Moreover, the reliability requirement of the ICC should be very high since it is desirable that it not be replaced even for several years. An ICC device installed inside a car device for phone calls may also be used to generate alerts in case of theft or a car accident. In this case, the ICC is usually not continuously powered on, and the voltage supply is substantially not stable. Still further, a gas meter device storing an ICC may be used to send the gas meter measurement on a regular basis or upon a specific event. This information may automatically be transmitted via an SMS or a data protocol. All the applications referred above, i.e. man-to-machine applications, such as a telecommunication applications and M2M applications, suffer from the limitations that the loss of reliability of the non volatile memory of the ICC is not controlled at application layer.

For clarity, below are some examples of loss of reliability. Non-volatile memory typically cannot guarantee that memory cells not updated for more than a predetermined time period, for instance for more than ten years, correctly store data. This problem is also known as reliability on data retention of the non-volatile memory. For example, in a flash memory, the electric charges of memory cells are associated with respective bits and thus to corresponding data stored in the flash memory. However, if a cell is not updated for some time to restore the corresponding electric charge, this charge slowly dissipates and data associated therewith is lost.

Non-volatile memory reliability also involves other factors, for example, a limitation on the number of writing cycles supported by the memory. In fact, after a predetermined number of writing cycles on a same memory cell, further operations on such cell, i.e. reading access or writing access, may not be executed correctly. Thus, data previously stored may be lost. Other factors involving reliability of memory are the deterioration of the hardware or connection between the ICC and the device thereto coupled, i.e. the handset or the system device.

As cited above, the current methods for controlling loss of reliability are not available or managed from the applications of the ICC. This is due to the fact that typically only the operating system has the control of the hardware, and thus on the non volatile memory, and the applications are coupled to respective portions of such non-volatile memory generally only through the operating system. This serves to increase the portability of applications on different operating systems, in compliance with predetermined interfaces between the core operating system and the applications, such as Java Card and ETSI TS 102 241.

Thus, at the application layer, it may be desirable to detect or interpret the status of the non-volatile memory, due to the nature of the above mentioned interface, and thus control the reliability of the non-volatile memory. That is to say, the ICC operating system (OS) merely provides the application program with interfaces for accessing and updating data in memory, and the ICC OS is responsible for managing the physical aspect of memory, for example, memory refreshing and the memory page table.

For example, the application generally has no way to understand if the memory is losing reliability due to the limited data retention or to the limited writing cycles. Thus, controlling, from the application, the reliability of a non-volatile memory associated with or coupled to the application itself may be a relevant technical problem in the field of ICCs.

Moreover, the ICC operating system cannot measure time because the ICC is not always powered on. Thus it cannot determine whether a predetermined time period, for example, five years, has elapsed to alert the application of a potential data retention problem.

On the other end, measuring the time based upon a request to the handset device, for example, requesting a current date or time with a "provide local information proactive command" as specified in 3GPP TS 31.111, may not be safe because it depends on the reliability of date or time returned by the handset device. Neither receiving an SMS nor data over other bearers on a regular basis, to detect the elapse of time, is secure. In fact, the ICC should rely on an external bearer. Moreover, this approach typically involves undesired costs for transmitting the SMS to the ICC. Thus, it may be desirable to manage the loss of reliability due to the data retention at application level, and such problem of data retention is not easily detected at the operative system layer, since the operating system cannot measure the elapsed time. Moreover, applications do not have any means to request specific actions to increase memory reliability, e.g., no way exists for an application to request the refreshment of all memory areas to extend data retention in case a data retention problem is identified.

With respect to deterioration of the hardware or connection between the ICC and the system device, in traditional machine-to-man systems, the handset may send through the corresponding machine-to-man interface a message associated with the reliability of the non-volatile memory, allowing the user to substitute the ICC. However, if the ICC is connected to a system device with a M2M interface, no machine-to-man interface is available to alert a user to substitute the ICC. Thus, the known method cannot react to a loss of reliability of the memory when the ICC is used for a M2M application.

In other words, the problem of the prior art lies in that although the non-volatile memory (NVM) in the ICC has constraints on a limited number of updates and a limited time for data retention, the application has no way of knowing the status of the NVM because no interfaces are provided by the ICC OS.

Thus, it may be desirable to provide a method and a system for controlling possible loss of reliability of non-volatile memories incorporated into an ICC, especially due to the limited data retention of such memory, to the limited writing cycles of the memory, and to possible deterioration of the hardware or connection with the device coupled to the ICC. It may also be desirable to improve the reliability of the non-volatile memory in a plurality of scenarios in which the corresponding ICC is used, including man-to-machine applications and machine-to-machine applications.

SUMMARY OF THE INVENTION

The present invention is directed to controlling a loss of reliability of a non-volatile memory (NVM) included in an integrated circuit card (ICC) at the level of the operating system of the ICC. An event-service communication model may be implemented between the operating system and the applications of the ICC which enables the operating system to alert the applications when a loss of reliability is detected on a portion of the non-volatile memory associated with the application and further enabling the application to react to such detected loss of reliability at application layer.

The technical problem is addressed by a method for controlling a non-volatile memory (NVM) included in an integrated circuit card (ICC) that includes determining whether the NVM is reliable or not at the OS side and generating an event associated with the reliability of the NVM at the OS side to the application, if the NVM is determined to be unreliable. This improves the reliability of the NVM in the ICC in the sense that the application can be aware of the status of NVM, and it knows the operating environment.

The terms "reliable" in the following description shall be interpreted in the sense that a memory cell may be considered "more reliable" than another memory cell, below indicated as "not reliable" or "unreliable", since the former guarantees a longer and safer storage for the data, for example, because it has been less stressed or more recently updated.

According to an aspect, a detection of the reliability is executed by programming a predetermined memory portion of a non-volatile memory of an ICC so that its memory reliability is reduced with respect to a reliability of the other memory cells of the non-volatile memory. A recovery procedure is implemented on the other memory cells when the predetermined memory portion is detected to be unreliable.

Advantageously, the detection of reliability at operating system layer is not based on a time measure but on a comparison between the predetermined pattern and the data stored in the predetermined portion of memory. In an embodiment, the detection of reliability may be triggered by an application which may measure time based upon the device to which it is connected. Accordingly, the schedule of request to the operating system to check the reliability of the non-volatile memory may be associated with an application environment wherein the ICC is used, both in a man-to-machine application environment or in a machine-to-machine application environment. However, the detection of reliability is based on the way in which the predetermined memory portion or cell is programmed with the predetermined pattern, i.e. on the electric features of the programming operation and/or on the hardware characteristics of the non-volatile memory. Thus, the detection of reliability for data retention is implemented integrating the data available at the application layer, i.e. the information available to the application and associated with the environment in which the application runs (for example, a gas meter application), and data available at operating system layer, i.e. the data stored in the memory cell associated to the predetermined pattern.

According to this embodiment, determining the reliability of the NVM is performed by writing the prescribed pattern in a prescribed location of the NVM with a weak update mechanism. A stored pattern is retrieved from the prescribed location of the NVM. The prescribed pattern is compared with the stored pattern, and it is determined whether the NVM is unreliable, if the prescribed pattern is different from the stored pattern. If the NVM is determined to be unreliable, the OS of the ICC generates an event warning with respect to data retention and dispatches the event to the application. Then, the application may call for the refreshing of the data of NVM provided by the OS. This allows the OS to determine when the NVM must be refreshed to reduce loss of stored information. If necessary, the application may call the service provided by the OS to refresh all or part of data store in NVM.

In another embodiment, examining the reliability of the NVM may be performed by detecting a write access for each cell or a set of cells in NVM, and updating a counter value of a prescribed location of NVM, the prescribed location of NVM corresponding to the each cell or the set of cells in NVM, and comparing the counter value of a prescribed location of NVM with a first predetermined value. Examining the reliability of the NVM also may also be performed by determining that the NVM is unreliable if the counter value of a prescribed location of NVM exceeds the first predetermined value.

If the NVM is determined to be unreliable, the OS of the ICC generates an event warning of a maximum data update and dispatches the event to the application. Then, the application may call the service of extending the write cycles number. More particularly, when the service extending the write cycles number is called, the OS flags each cell or the set of cells as non-usable and moves the data stored therein to different cells of NVM. In this way, the write access to the used up cells can be avoided.

The NVM may be detected to be unreliable because one or more memory cells have been written over the predetermined limit and also because data stored in one or more memory cells have not been updated for a long period. In this case, the OS generates both events, i.e. an event warning of a maximum data update and a data retention event.

Further advantages and features of the method for controlling reliability of non-volatile memory and the ICC according to the present invention will be apparent from the description given here below only for exemplificative purpose and without limiting the scope of protection of the present invention.

DETAILED DESCRIPTION OF THE PREFERRED EMBODIMENTS

Figure 1:
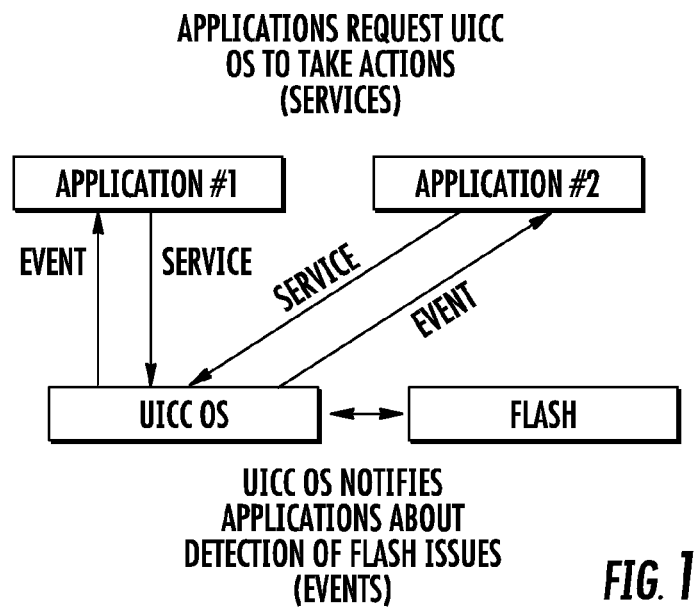
FIG. 1 is a schematic diagram illustrating the method for detecting reliability of non-volatile memory, according to the present invention.

With reference to FIG. 1, an ICC illustratively includes logical components such as one or more applications and an operating system (OS), and physical components, such as, a non-volatile memory, for example, a FLASH memory. The FLASH memory stores data for a relatively long time even after power is not supplied.

The ICC operating system (OS) provides services to applications, and applications request the ICC OS to take actions on or control the hardware, e.g. the non-volatile memory through such services. More particularly, the ICC OS manages the FLASH memory and communicates with applications when it detects events on such memory. In other words, the ICC OS communicates with applications by a service and event protocol.

The control of a loss of reliability of the non-volatile memory is executed by integrating the capability of the OS to detect hardware events, i.e. on the non-volatile memory, and the knowledge of the application on the environment in which is runs, thus implementing a reaction at the application layer when a loss of reliability is detected at the OS layer. In this respect, the ICC OS 40 alerts applications 42, 44, 46, 48 when a an event related to the non-volatile memory is detected and provides services to the applications 42, 44, 46, 48 to execute recovery actions to extend reliability of memory, for example, to react to a data retention or to an elevated number of updates on same cells.

Hereinafter, an embodiment of the method for enhancing data retention and number of updates will be explained in detail. To notify the applications that memory is losing reliability, the following events are provided. One event is an event warning on data retention. This event is generated by the OS when it detects that memory retention is losing reliability. For example, with some NOR memories, data is to be retained for at least ten years, so a warning on data retention event should be generated after five years from the last update in a less recently written cell.

A predetermined memory cell of the non-volatile memory is updated with predetermined electronic parameters according to which a predetermined reduced data retention is obtained. Such predetermined reduced data retention may be less than the data retention by all the other cells of the non-volatile memory.

As an example of predetermined electronic parameters, a predetermined programming voltage for a reduced time may be applied to the predetermined memory cell of memory, resulting in data with a lower data retention. This operation is defined as weak update.

According to another embodiment, the predetermined programming parameters allows writing of the predetermined memory cell by applying a reduced programming voltage to such predetermined cells for a same time period according to which the other memory cells are written. The predetermined electronic parameters include applying a reduced programming voltage for a reduced programming voltage to the predetermined memory cell. Accordingly, the following protocol is defined to generate the event which raises the application reaction.

A known pattern is written in a specific memory cell with the weak update mechanism. The pattern is checked, for example, on a predetermined time schedule. When the pattern does not match the initial value, the warning on data retention event is generated from the ICC OS to the application.

Figure 2:
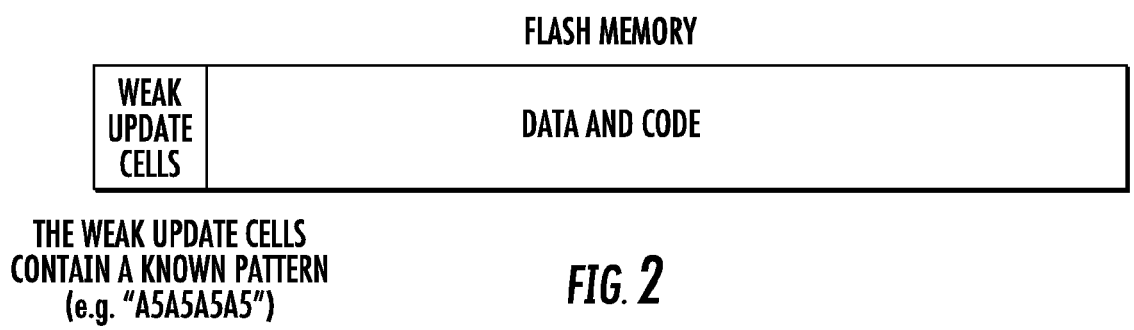
FIG. 2 is a schematic diagram of the method for detecting the reliability of the non-volatile memory, according to an embodiment of the present invention detecting the limit of writing cycles.

FIG. 2 schematically illustrates a flash memory on which the weak update mechanism is applied. A portion of flash memory, i.e. some cells on flash memory, is updated with the weak update mechanism. For example, these cells are updated with a value of "A5A5A5A5".

Since data retention of the weak update is shorter than data retention of the other memory cells of the non-volatile memory, when the ICC OS notifies an event to the application, the application may take a measure on the other cells of non-volatile memory before other memory cells have incurred a data loss.

Another event to notify that applications that memory is losing reliability may include an event warning on the writing of update cycles. This event is generated by the operating system when it detects that a memory cell has been written a number of times close to the maximum number of updates. This event is generated by adding counter information to each memory cell or to sets of memory cells (e.g. memory pages) in the NVM. When the highest of this counter reaches a specific value, then the event is generated. For example, if the technology foresees 100,000 read/write cycles, the event is generated if a counter has reached the value of 50,000 read/write cycles.

The event generated to the application can also indicate information about the data that has been written too many times. For example, the information can include an address and the stored value of the address on which the data was overwritten.

Another event to notify that applications that memory is losing reliability may include an ICC event refused by handset. A possible scenario of the M2M involves the possibility of the M2M ICC being inserted in devices that are never enhanced by an MMI, e.g. in a gas meter there is generally no user interface as the gas meter could also not have a display.

According to the method, to manage this kind of loss of reliability, an event is generated at OS layer for the ICC applications, indicating that the former session has not been closed correctly. At a subsequent session, applications registered to this event react to the detect reliability, depending on the applicative environment. For example, in a gas meter application, an SMS to a specific remote server may be sent. An automotive system could inform a failure of a collecting system to track the fail, etc. According to the method, a "Network Rejection" event, i.e. an event associated with a rejection of the ICC by the network due to an authentication data failure, as specified by the ETSI TS 102 223 standard, may be managed.

To let the applications react to the aforementioned events, the method provides a step for calling services provided by the OS from the applications to extend the non-volatile memory reliability. According to an aspect, the following mechanisms are implemented.

One mechanism is a service for data retention mechanism. The service is called by an application, and the OS executes a procedure to extend data retention, for example, it rewrites (or refresh) all the data in the memory cells. Alternatively, the OS rewrites a portion of data in the memory cells required to be refreshed.

This service can be called by the application when an even occurs. For example, this service can be called when an event associated with a warning on data retention is generated by the OS, and when an event is generated by the application, for example, when an SMS is received.

Another mechanism is a service for extending write cycles number. Once this service is invoked by an application, the OS executes a procedure to avoid updating predetermined memory cells which have been already stressed with a predetermined maximum number of writing cycles. For example, the OS flags the cell as not usable and moves the relevant data to a different memory cell logically replacing the previous cell. This service is called by the application based on the application logic, including an event warning on update cycles writing generated by the OS, and too many updates performed by the application in a specific memory field, which are counted by the application.

Figure 3:
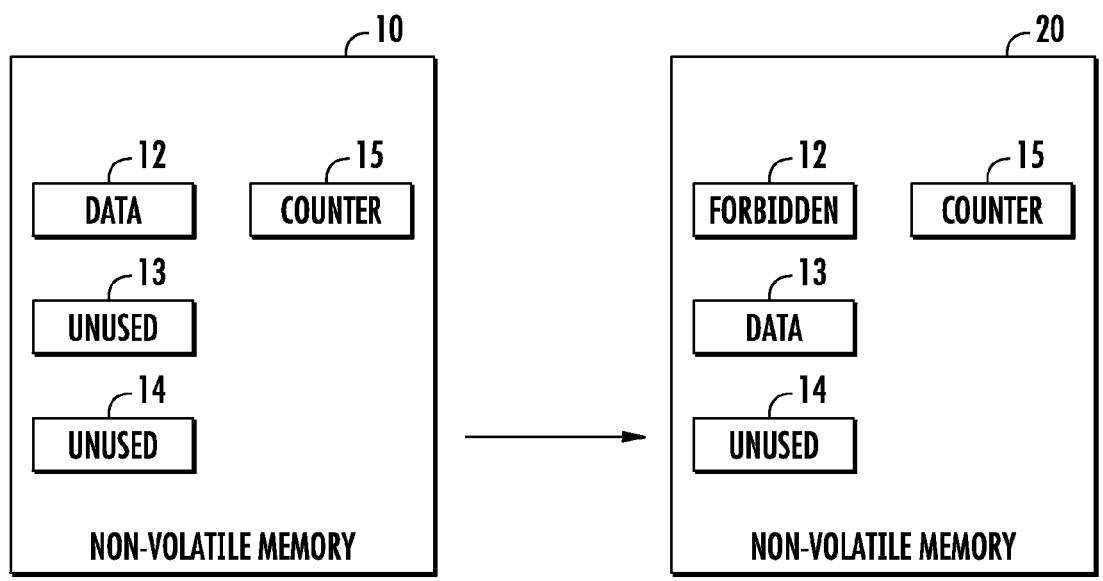
FIG. 3 is a schematic diagram illustrating a change of memory status when the service for extending write cycles number is invoked, according to the method of the present invention.

With reference to FIG. 3, the NVM 10 includes some memory cells, one of which stores data 12, and the other 13, 14 is unused. The NVM also includes memory space 15 allocated for a counter of write access to the cell 12 of data. The method described above for detecting reliability based upon the write access is also applicable to count other consuming operations on the memory, for example, a read operation causing a deterioration of cells of a corresponding memory may be monitored to control the reliability of such memory. If the application calls the service for extending write number cycles, the status of NVM 20 is changed, the OS reads the data 12 and moves it to new location 13 in memory which is unused. Then, the OS marks the previous cell or sets of cells as unusable.

Different memory management schemes may be applied based upon the frequency of the updates of the memory. According to an aspect, since the method steps for controlling the loss of reliability of the non-volatile memory involve an overhead of computation or memory, the memory is split in at least two different areas during card configuration. One area is an area for a "high update", for storing the data to be often updated (e.g. location information). Another area is an area for a "low update", for storing other data (e.g. the operating system).

This distinction is available in the SIM/ICC. In fact, all files specified for the telecom access applications (SIM application, specified in GSM 11.11 and USIM application, specified in 3GPP TS 31.102) indicate that they are to be considered as high or low frequency updateable.

Moreover, to reduce the overhead of the high update on both areas, the operating system may be designed to detect the event associated to the limitation on the number of writing cycles only over the high update area and to detect the event associated to data retention only over the low update area. In fact, the high update area may be updated and refreshed so frequently that a loss of data retention does not occur. In a preferred embodiment, applications define data to be included in the high update area and data to be included in low update area.

The present embodiments advantageously improve the control of loss of reliability of the NVM in an ICC because the application can be aware of the status of NVM, and it knows the operating environment. Advantageously, the present embodiments also allows the ICC OS to detect that a time in which a memory portion may be considered reliable is elapsed and to determine when the NVM is to be refreshed to reduce the loss of data. Advantageously, a memory cell or section of cells in NVM where the counter value is stored may not be damaged by excessive writing cycles.

Advantageously, by dividing the area of NVM into a high update area and low update area, the detection of reliability on write cycle update is applied only to the high update area and the detection of reliability for data retention is applied only to low update area, thus optimizing memory management, i.e. reducing the counters for counting write access to the memory and refreshing only low update area when warning for data retention occurs.

The invention claimed is:

1. A method for controlling a loss of reliability of a non-volatile memory (NVM) comprising:
   determining whether a portion of the NVM is reliable using an operating system (OS) by at least
      writing with a weak update mechanism a prescribed pattern in a prescribed location of the NVM,
      retrieving a stored pattern from the prescribed location of the NVM,
      comparing the prescribed pattern with the stored pattern, and
      determining that the portion of the NVM is unreliable, if the prescribed pattern is different from the stored pattern;
   generating a data retention warning associated with the reliability of the NVM using the OS;
   communicating the data retention warning to an application operatively coupled to the OS if the portion of the NVM is determined to be unreliable; and
   dividing the NVM into a plurality of different areas comprising a first memory area for storing data to be updated and a second memory area for storing other data, the OS detecting events associated with the data retention warning only over the second area.

2. The method according to claim 1, further comprising calling, by the application, a service provided by the OS to recover the reliability of the NVM.

3. The method according to claim 2, wherein the service called by the application refreshes data of the NVM.

4. The method according to claim 1, wherein writing with the weak update mechanism comprises programming the prescribed location with electronic parameters according to which the retention of the prescribed pattern in the prescribed location is reduced with respect to the retention of data on other memory locations of the NVM.

5. The method according to claim 4, wherein the electronic parameters comprise at least one of a reduced time of application of a voltage for programming the prescribed location and a reduced programming voltage.

6. A method for controlling a loss of reliability of a non-volatile memory (NVM) comprising:
   determining whether a portion of the non-volatile memory (NVM) is reliable using an operating system (OS) by at least
      detecting a write access for at least one memory cell in the portion of the NVM,
      updating a counter value of a prescribed location of the portion of the NVM, the prescribed location of the NVM corresponding to the at least one memory cell,
      comparing the counter value of the prescribed location of the NVM with a first value, and
      determining that the NVM is unreliable if the counter value of the prescribed location exceeds the first value;
   generating a maximum data update warning associated with the reliability of the NVM using the OS;
   communicating the maximum data update warning to an application operatively coupled to the OS if the portion of the NVM is determined to be unreliable; and
   dividing the NVM into a plurality of different areas comprising a first memory area for storing data to be updated and a second memory area for storing other data, OS detecting events associated with the maximum data update warning only over the first area.

7. The method according to claim 6, further comprising calling, by the application, a service provided by the OS to recover the reliability of the NVM.

8. An integrated circuit comprising:
   a non-volatile memory (NVM) comprising first and second memory areas from among a plurality thereof, the first memory area for storing data to be updated and the second memory area for storing other data; and
   circuitry comprising
      an application, an operating system (OS) cooperating with said NVM and the application, the OS being configured to detect whether a portion of said NVM is unreliable, and generate an event associated with the reliability of said NVM for the application, if the portion of said NVM is unreliable, a weak update mechanism configured to write a prescribed pattern in a prescribed location of said NVM, and a comparator configured to compare the prescribed pattern with the pattern stored in the prescribed location of the NVM, the OS being further configured to
determine that the NVM is unreliable if the prescribed pattern is different from the stored pattern,
communicating a data retention warning as an event for the application, and
detect events associated with the data retention warning only over the second memory area.

9. The integrated circuit according to claim 8, wherein the application is configured to call a service provided by said OS to recover the reliability of said NVM.

10. The integrated circuit according to claim 8, wherein said weak update mechanism is configured to program the prescribed location with electronic parameters according to which retention of the prescribed pattern in the prescribed location is reduced with respect to a retention of data on other memory locations of said NVM, the electronic parameters comprising a reduced time of application of a voltage for programming the prescribed location.

11. The integrated circuit according to claim 10, wherein the application is configured to call a service provided by triggering the OS to refresh data of said NVM.

12. An integrated circuit comprising:
a non-volatile memory (NVM) comprising first and second memory areas from among a plurality thereof, the first memory area for storing data to be updated and the second memory area for storing other data; and
circuitry comprising
an application,
an operating system (OS) cooperating with said NVM and the application, the OS being configured to detect whether a portion of said NVM is unreliable, and generate an event associated with the reliability of said NVM for the application, if the portion of said NVM is unreliable,
a write access detector for at least one memory cell in said NVM,
an access counter configured to count access to a prescribed location of said NVM, the prescribed location corresponding to the at least one memory cell in said NVM, and
a comparator configured to compare a value of said access counter of the prescribed location with a first value,
the OS being configured to
determine that said NVM is unreliable if the value of said access counter access exceeds the first value,
communicate a maximum data update warning as an event for the application, and
detect events associated with the maximum data update warning only over the first area.

13. The integrated circuit according to claim 12, wherein the application is configured to call a service provided by said OS to recover the reliability of said NVM.

* * * * *